US011262577B2

(12) United States Patent  
Sarkar et al.

(10) Patent No.: US 11,262,577 B2  
(45) Date of Patent: Mar. 1, 2022

(54) PACKAGING FOR COMPACT OBJECT-SCANNING MODULES

(71) Applicant: AdHawk Microsystems, Kitchener (CA)

(72) Inventors: Niladri Sarkar, Waterloo (CA); Dong Yan, North York (CA); Geoffrey Lee, Kitchener (CA); Arash Rohani, Waterloo (CA); Nino Zahirovic, Waterloo (CA); Duncan Wesley Strathearn, Waterloo (CA)

(73) Assignee: AdHawk Microsystems, Kitchener (CA)

( * ) Notice: Subject to any disclaimer, the term of this patent is extended or adjusted under 35 U.S.C. 154(b) by 493 days.

(21) Appl. No.: 16/232,410

(22) Filed: Dec. 26, 2018

(65) Prior Publication Data

US 2019/0196179 A1 Jun. 27, 2019

Related U.S. Application Data

(60) Provisional application No. 62/610,493, filed on Dec. 26, 2017.

(51) Int. Cl.
| | |
|---|---|
| *G02B 26/00* | (2006.01) |
| *G02B 26/08* | (2006.01) |
| *G02B 26/10* | (2006.01) |
| *B81B 7/00* | (2006.01) |
| *G02B 27/42* | (2006.01) |
| *G02B 27/10* | (2006.01) |
| *G02B 27/00* | (2006.01) |

(52) U.S. Cl.
CPC ........ *G02B 26/0866* (2013.01); *B81B 7/0067* (2013.01); *G02B 26/0808* (2013.01); *G02B 26/101* (2013.01); *G02B 26/106* (2013.01); *G02B 27/1086* (2013.01); *G02B 27/425* (2013.01); *B81B 2201/042* (2013.01); *G02B 27/0018* (2013.01)

(58) Field of Classification Search
CPC ............ G02B 26/0866; G02B 27/1086; G02B 26/0808; G02B 26/101; G02B 26/106; G02B 27/425; G02B 27/0018; B81B 7/0067; B81B 2201/042
USPC ....................................... 359/290
See application file for complete search history.

(56) References Cited

U.S. PATENT DOCUMENTS

| | | | |
|---|---|---|---|
| 2007/0001248 A1 | 1/2007 | Geisberger et al. | |
| 2015/0047078 A1 | 2/2015 | Sarkar et al. | |
| 2017/0067609 A1* | 3/2017 | Ichikawa | F21S 41/125 |

* cited by examiner

*Primary Examiner* — James C. Jones  
(74) *Attorney, Agent, or Firm* — Kaplan Breyer Schwarz, LLP

(57) ABSTRACT

The present disclosure is directed to compact packaging for optical MEMS devices, such as one- and two-dimensional beam scanners. An embodiment in accordance with the present disclosure includes a light source and a MEMS-based scanning element for steering at least a portion of the light provided by the light source in at least one dimension as an output light signal, as well as one or more optical elements for collimating and/or redirecting light within a sealed chamber defined by the elements of a housing. In some embodiments, the one or more optical elements include a reflective lens that collimates the light provided by the light source while simultaneously correcting phase-front error imparted by the scanning element while steering the output beam.

20 Claims, 14 Drawing Sheets

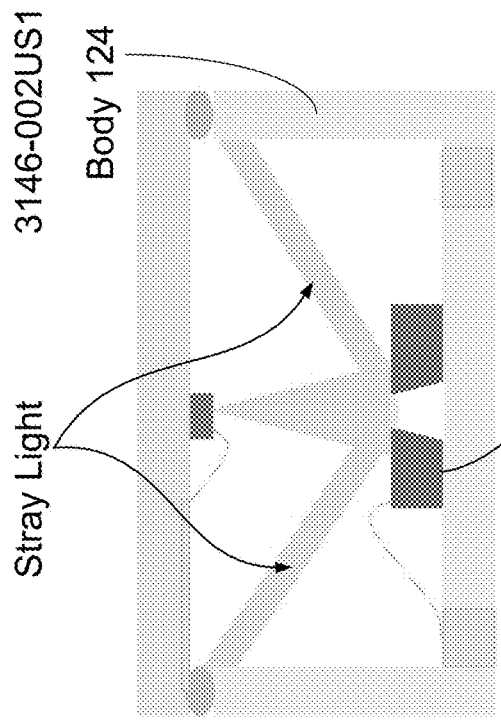
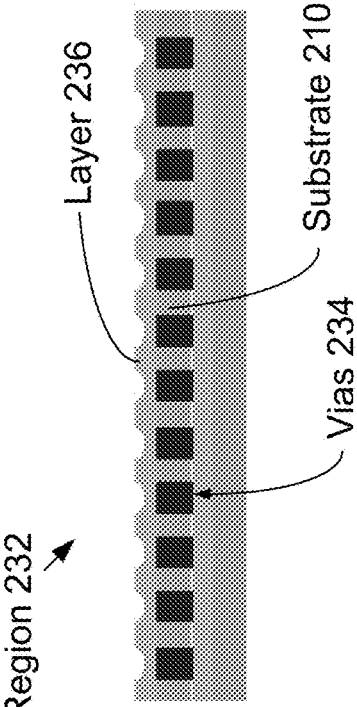
FIG. 2D
FIG. 2F
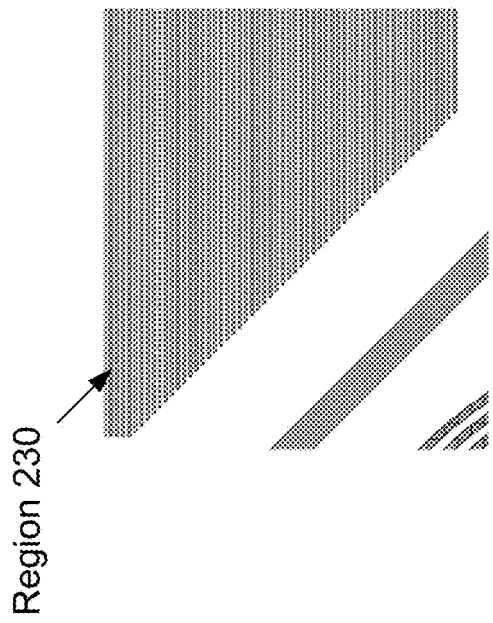
FIG. 2C
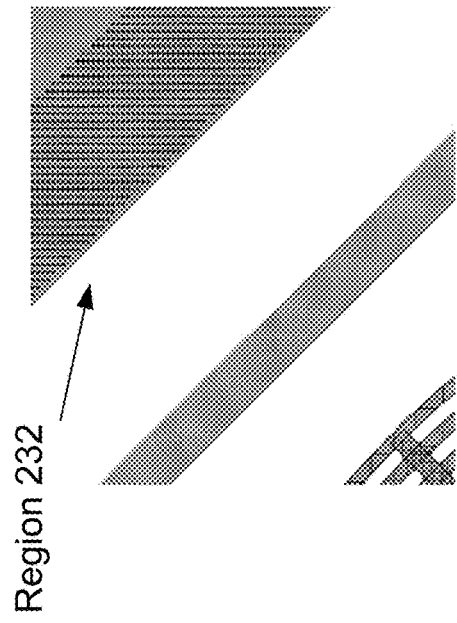
FIG. 2E

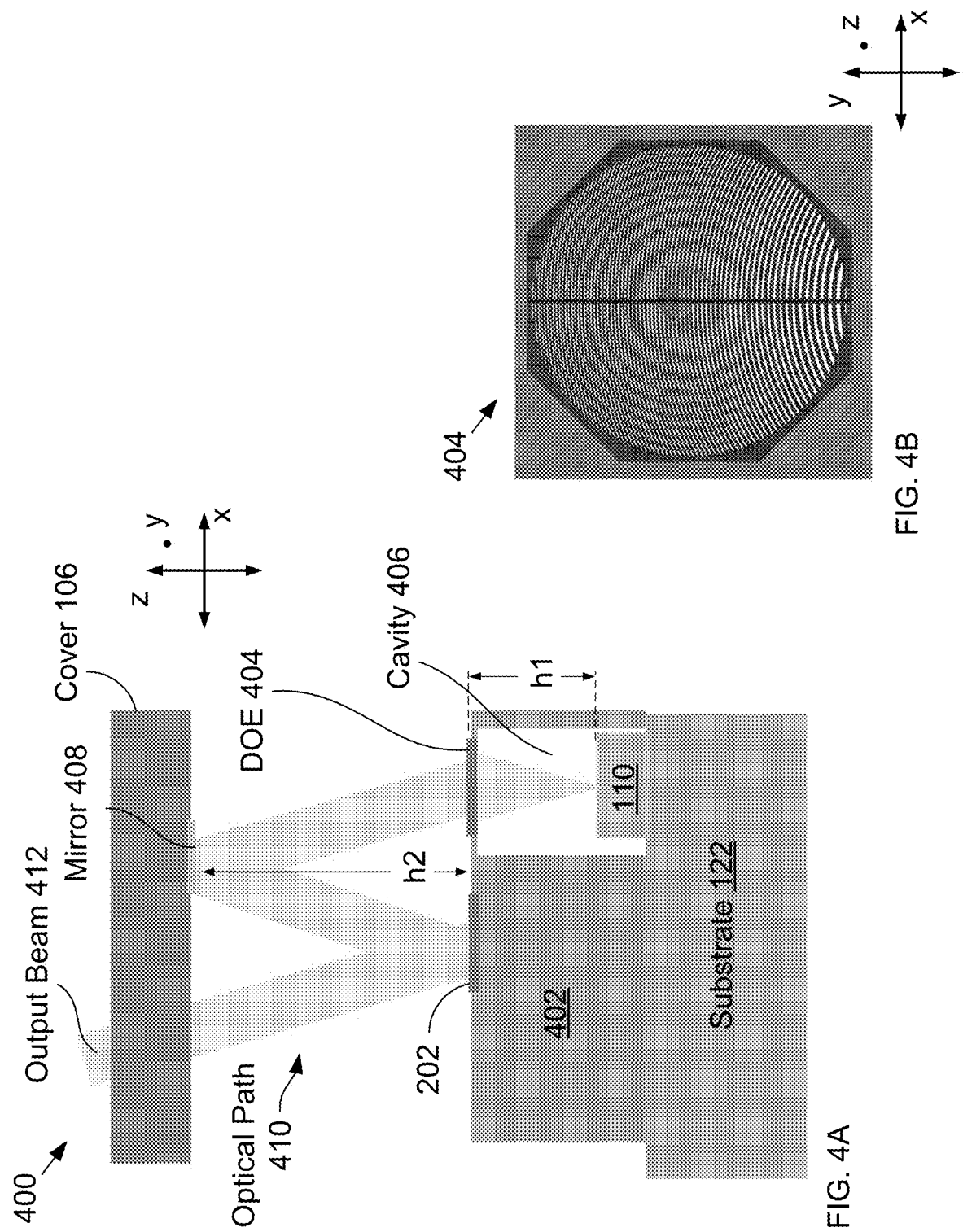

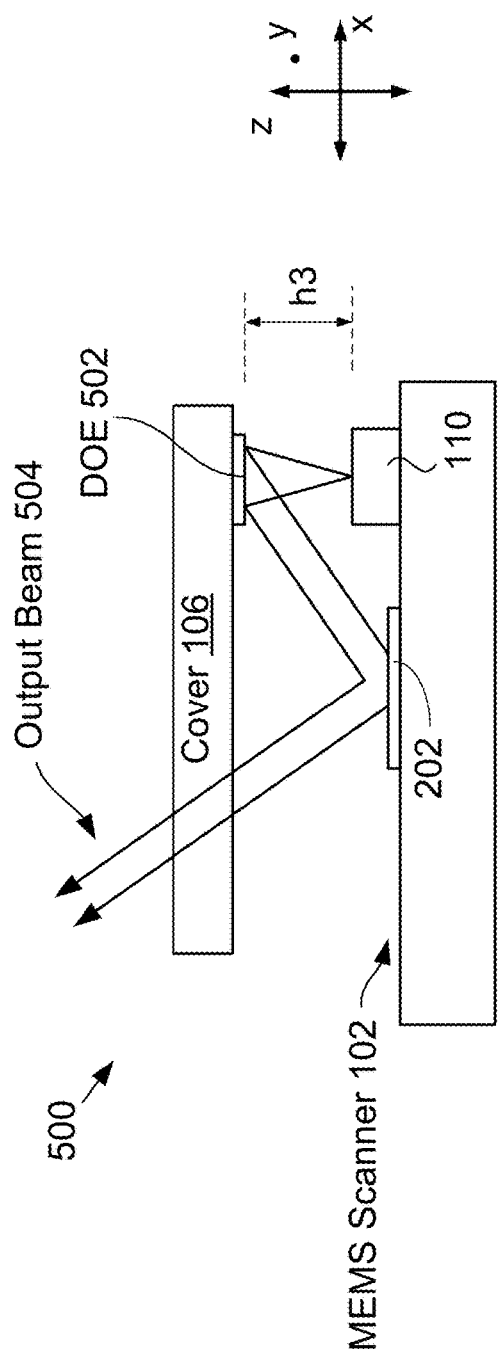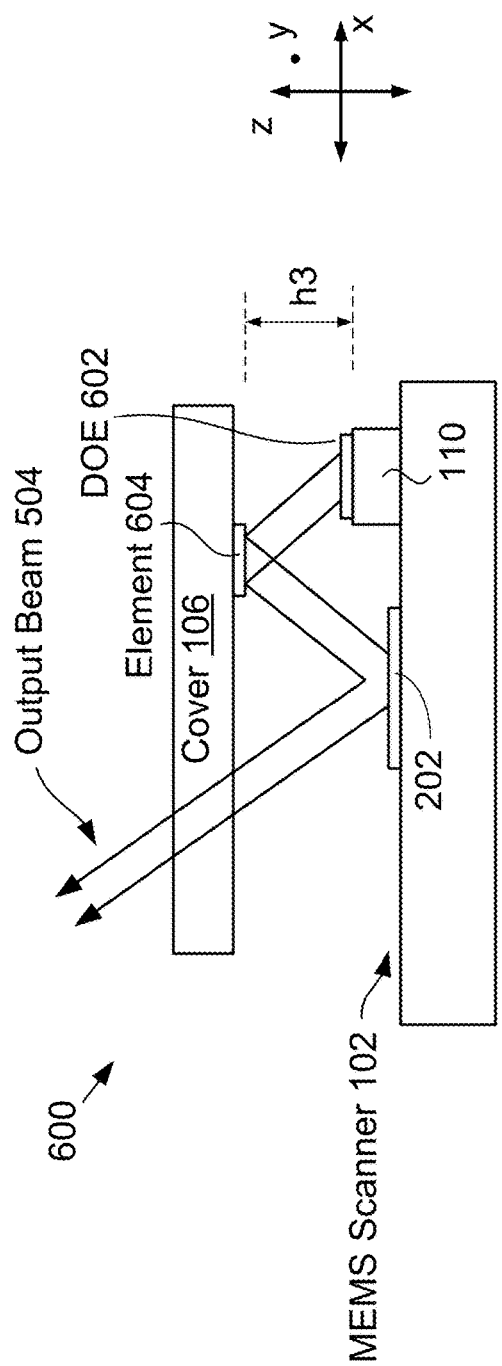

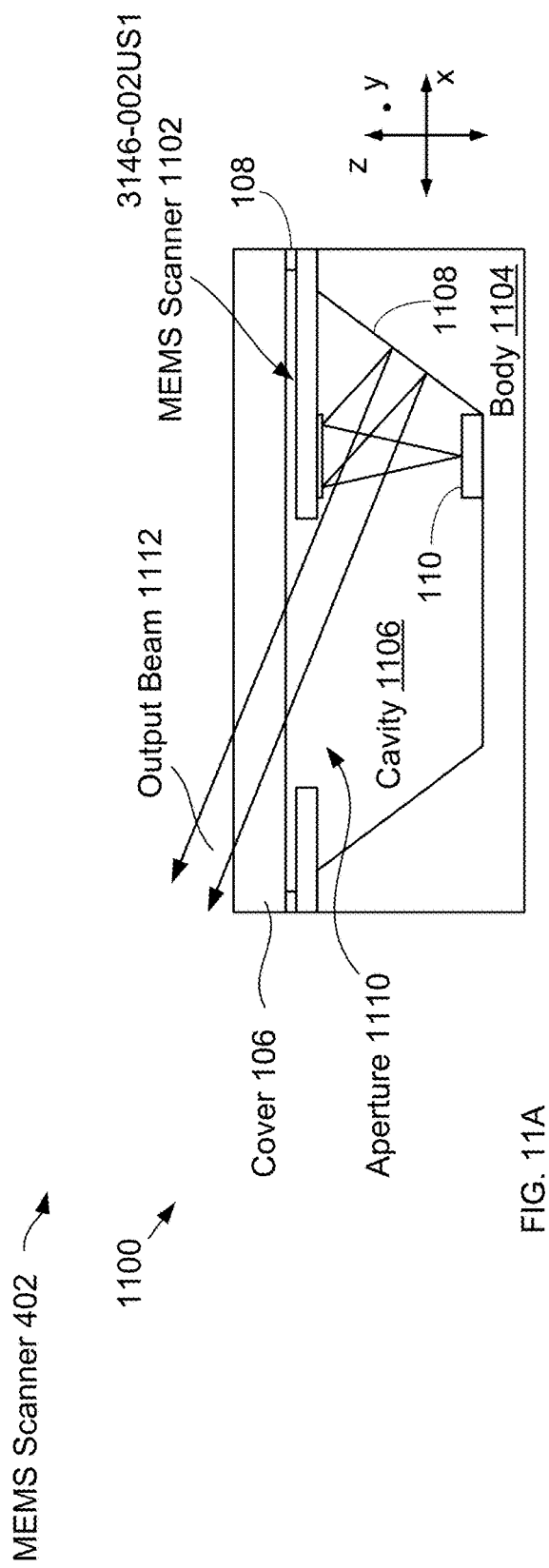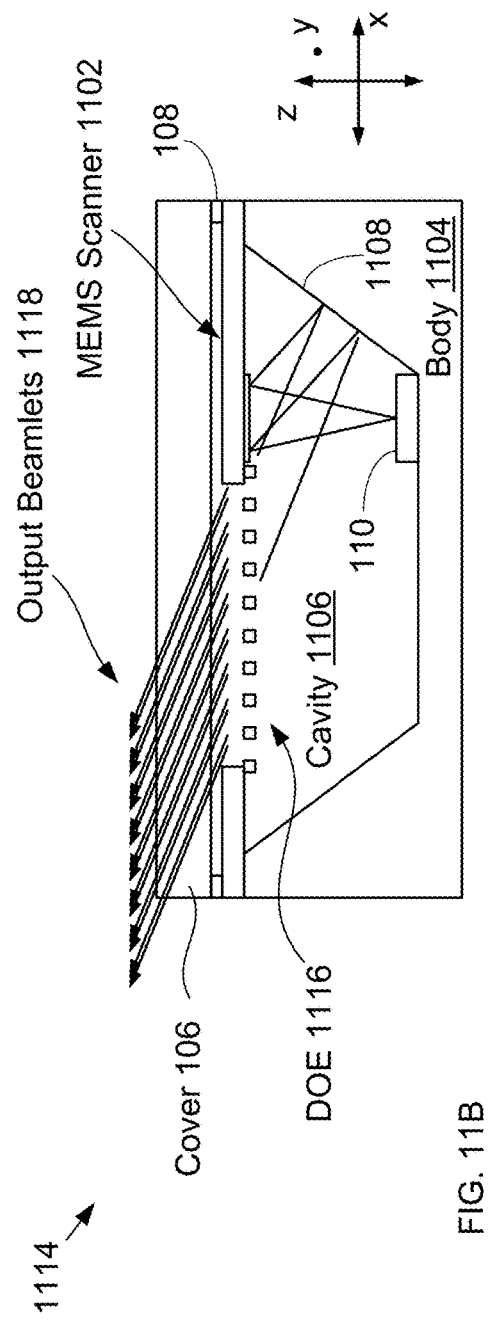
FIG. 11A
FIG. 11B

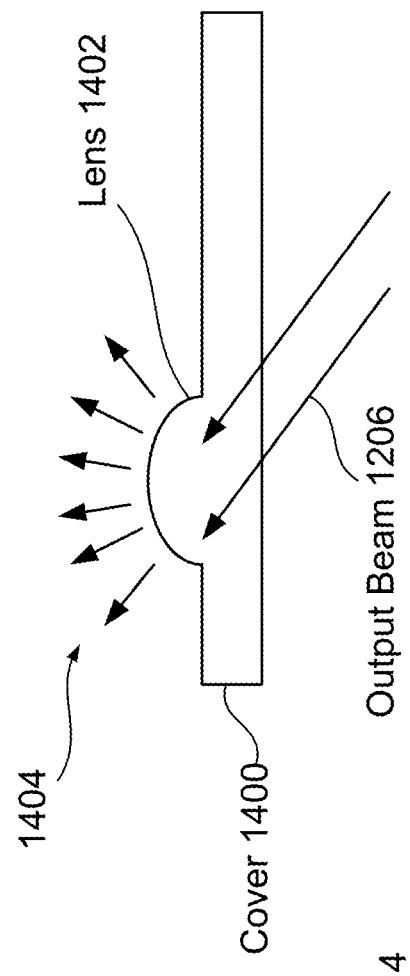

PACKAGING FOR COMPACT OBJECT-SCANNING MODULES

CROSS REFERENCE TO RELATED APPLICATIONS

This application claims the benefit of U.S. Provisional Patent Application Ser. No. 62/610,493 filed Dec. 26, 2017, the entire content of which is incorporated by reference as if set forth at length herein.

This application also includes concepts disclosed in U.S. Patent Publication No. US2016/0166146, published Jun. 16, 2017, and U.S. Patent Publication No. US2017/0276934, published Sep. 28, 2017, each which is incorporated by reference as if set forth at length herein. If there are any contradictions or inconsistencies in language between this application and the cases that have been incorporated by reference that might affect the interpretation of the claims in this case, the claims in this case should be interpreted to be consistent with the language in this case.

TECHNICAL FIELD

The present disclosure relates to optical packaging in general and, more particularly, to packaging for optical MEMS devices, such as MEMS-mirror-based beam-steering systems.

BACKGROUND

Scanner modules that integrate infrared (IR) illumination, beamforming and two-dimensional scanning functions are useful in a number of applications, such as eye tracking, micro-gesture recognition, industrial light curtains, range finding using LIDAR or point-cloud projection, free-space optical communication, path planning and control in robotics, object tracking in VR, to name a few.

Prior-art light scanners are typically based on scanning mirrors and actuators for moving them that are all on the order of 1 mm. To enable a large rotation, the package that surrounds the scanning mirror must have sufficient clearance. As a result, the dimensions of a prior-art packaged scanning mirror are quite large. In addition, in prior-art light-scanning systems, the light sources and refractive collimating optics required to produce a collimated light beam reside outside the scanning-mirror package, further increasing the space required for such light scanners. Still further, these light sources and optical elements are typically large, bulky, and expensive, which can limit their utility in some applications.

A compact scanner module that enables object tracking with high resolution and low cost would be a significant advance in the state of the art.

SUMMARY

The teachings of the present disclosure enable the reduction of the footprint and profile of a packaged beam scanner suitable for use in an object-tracking system. Embodiments in accordance with the present disclosure are particularly well suited for use in systems for eye tracking, micro-gesture recognition, industrial light curtains, range finding using LIDAR or point-cloud projection, free-space optical communication, path planning and control in robotics, object tracking in virtual-reality and/or augmented reality systems. Furthermore, the packaging concepts described herein are suitable for use in mobile products, such as smart watches, smart phones, smart glasses, and the like, many of which require components and modules having an extremely small footprint.

Scanner 100 is a low-profile, fully packaged, light-scanning module having a width of 4.5 mm, depth of 4.5 mm, and a height of 2.2 mm. The small overall package size and low profile of scanner 100 affords it significant advantages over light scanners of the prior art due to its very small package volume in many applications. In smart glasses, for example, it is desirable to integrate a light-scanning module into their frames such that it is unobtrusive, realizing a substantially "zero-footprint" integration.

An illustrative embodiment is a beam scanner comprising a light source and a beam-steering element, which are enclosed within a sealed chamber of a low-profile package housing. The light source is a vertical-cavity surface-emitting laser (VCSEL), which provides a light signal to the beam-steering element, which is a MEMS-based device comprising a Fresnel zone plate whose position about two orthogonal axes is controlled via isothermal actuators. The Fresnel zone plate collimates the light signal to form an output beam that is steered in two dimensions by the isothermal actuators and passes through a cover of the housing.

In some embodiments, the housing encloses additional optical elements that collectively define a folded optical path for the output beam, thereby enabling the packaged beam scanner to have even smaller size.

In some embodiments, the light signal is collimated via a reflective lens that directs the collimated beam to a MEMS-based beam-steering element that includes a two-axis scanning mirror that steers the output beam in two dimensions. In some of these embodiments, the reflective lens and MEMS-based beam-steering element are configured such that phase-error introduced by the beam-steering element is pro-actively corrected at the reflective lens. In some embodiments, this correction is achieved by locating the light source at an offset distance from the focal point of the reflective lens.

In some embodiments, the MEMS-based beam-steering element includes at least one region that mitigates transmission of scattered light from the packaged beam scanner.

In some embodiments, the housing includes a cover that blocks at least one wavelength not intended for inclusion in the output beam.

In some embodiments, the light signal is split into multiple light portions, each of which is directed to a different MEMS-based beam-steering element such that each light portion is independently controlled in at least one dimension.

In some embodiments, a MEMS-based beam-steering element receives a plurality of light signals and combines them into a composite output beam. In some of these embodiments, at least two of the plurality of light signals are characterized by different wavelengths.

An embodiment in accordance with the present disclosure is a scanner for steering a first output signal in at least one dimension, the scanner comprising: a light source configured to provide a first light signal; a first element configured to receive the first light signal and provide a first portion of the first light signal as a collimated beam; a scanning element that is a MEMS-based scanning element, the scanning element being operative for steering the first portion in a first dimension; and a housing that includes a substrate, a body, and a cover having a thickness, the cover comprising a first material that is substantially transparent for the first portion, wherein the substrate, body, and cover collectively define a sealed chamber that contains the light source and the scanning element; wherein the first output signal includes the first portion.

BRIEF DESCRIPTION OF THE DRAWINGS

FIG. 2C depicts a schematic drawing of a portion of a region 230 in accordance with the illustrative embodiment.

FIG. 2D depicts a schematic drawing of a cross-sectional view of scanner 200, wherein stray light is directed by regions 230 to the sidewalls of housing 104.

FIGS. 2E-F depict schematic drawings of top and cross-sectional views of an alternative stray-light-control region in accordance with the present disclosure.

FIG. 4A depicts a schematic drawing of a cross-sectional view of an alternative embodiment of light scanner suitable for use in an object-tracking system in accordance with the present disclosure.

FIG. 4B depicts a schematic drawing of a top view of DOE 402.

FIG. 5 depicts a schematic drawing of a cross-sectional view of another alternative embodiment of light scanner suitable for use in an object-tracking system in accordance with the present disclosure.

FIG. 6 depicts a schematic drawing of a cross-sectional view of another alternative embodiment of light scanner suitable for use in an object-tracking system in accordance with the present disclosure.

FIG. 11A depicts a schematic drawing of a cross-sectional view of another alternative embodiment of a light scanner in accordance with the present disclosure.

FIG. 11B depicts a schematic drawing of a cross-sectional view of another alternative embodiment of a light scanner in accordance with the present disclosure.

FIG. 14 depicts a schematic drawing of a cross-sectional view of alternative cover suitable for use in a housing in accordance with the present disclosure.

DETAILED DESCRIPTION

Figure 1:
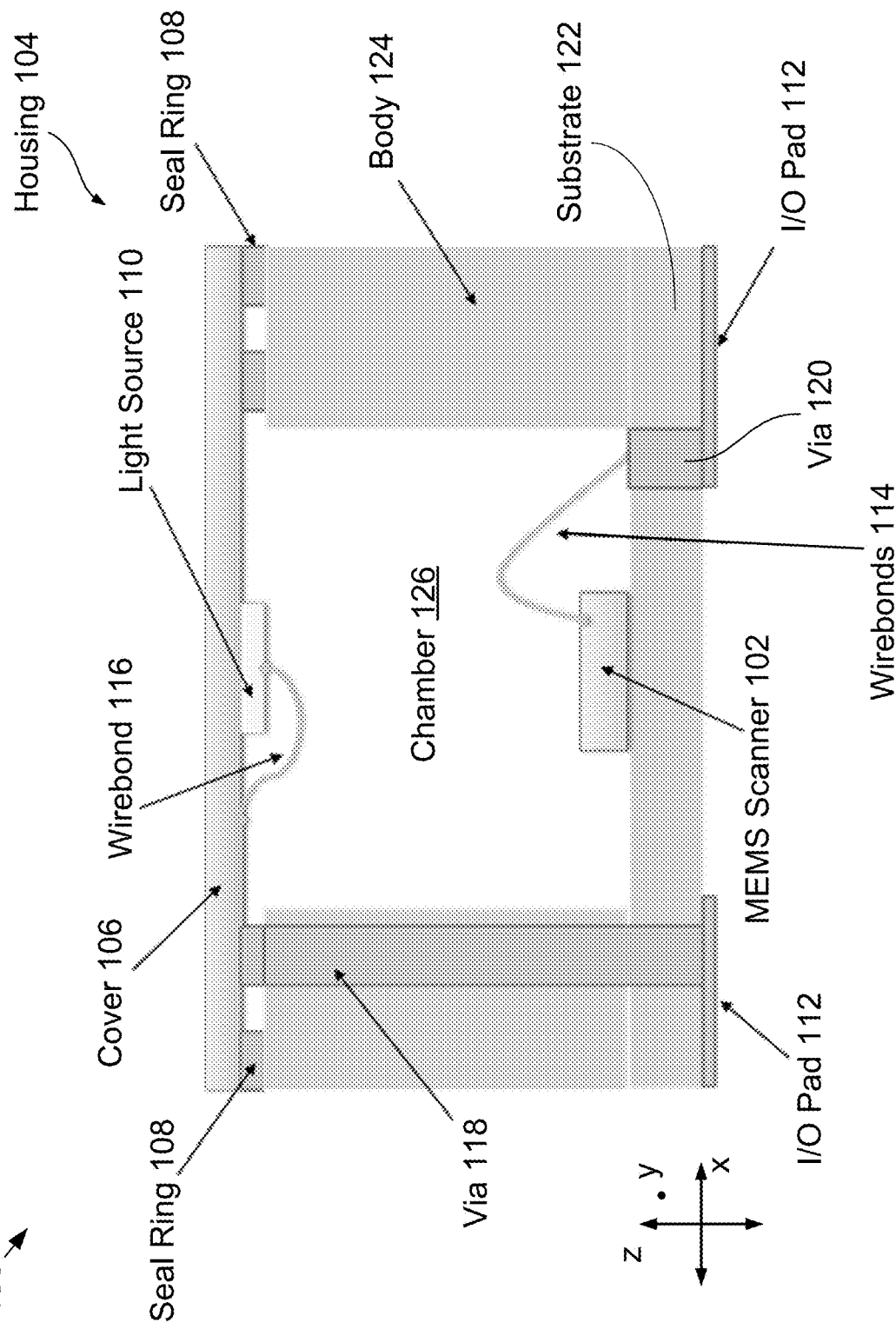
FIG. 1 depicts a schematic drawing of a cross-sectional view of an illustrative embodiment of light scanner suitable for use in an object-tracking system in accordance with the present disclosure.

FIG. 1 depicts a schematic drawing of a cross-sectional view of an illustrative embodiment of light scanner suitable for use in an object-tracking system in accordance with the present disclosure. Scanner 100 includes MEMS scanner 102, housing 104, and light source 110.

Scanner 100 is a compact scanner module in which a light signal provided by light source 110 is scanned in two dimensions via MEMS scanner 102.

MEMS scanner 102 is a two-dimensional (2D) scanning system that includes a scanning element that is operative for steering a light in two dimensions.

Figure 2A:
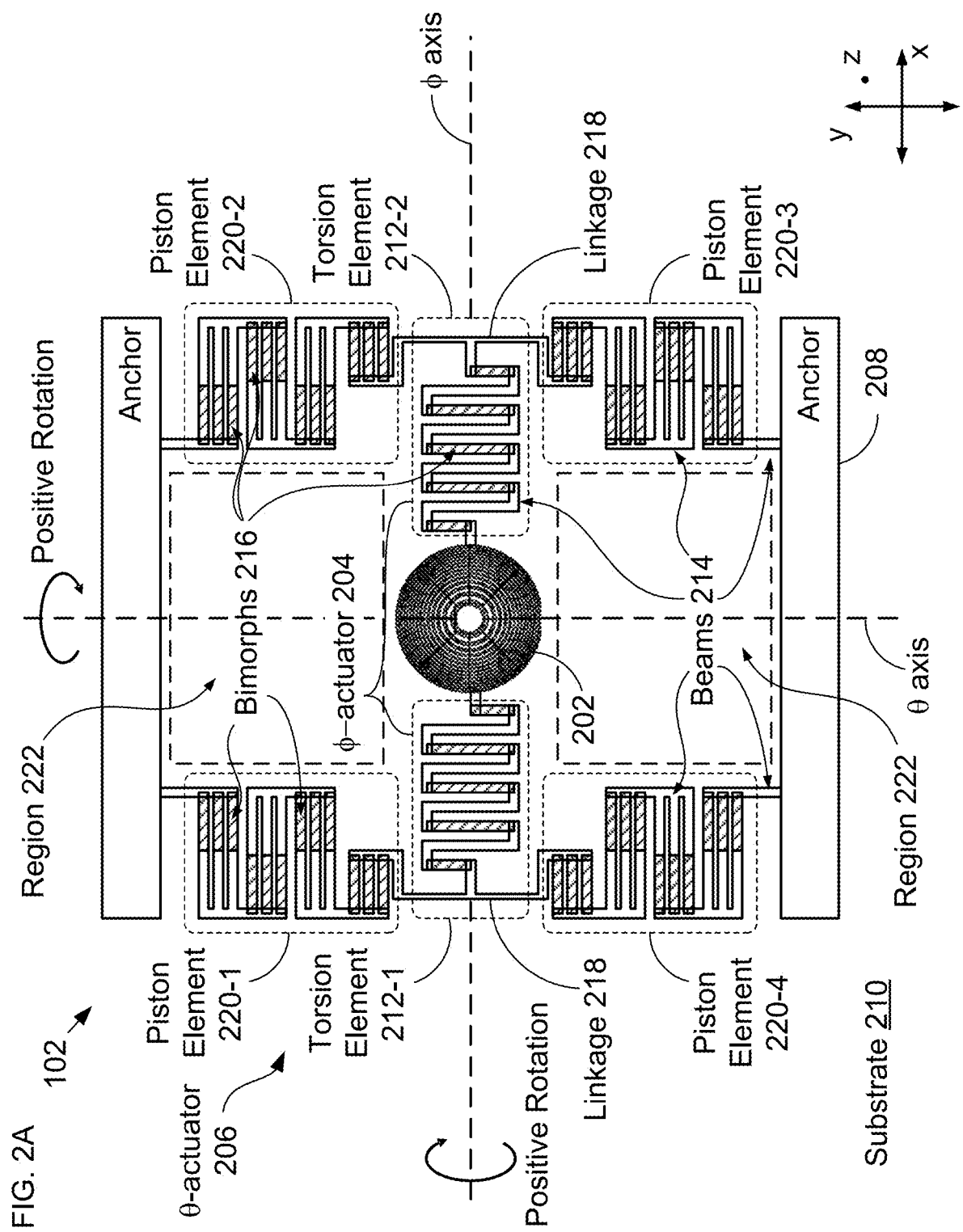
FIG. 2A depicts a schematic drawing of a perspective view of MEMS scanner 102.

FIG. 2A depicts a schematic drawing of a perspective view of MEMS scanner 102. MEMS scanner 102 includes scanning element 202, ϕ-actuator 204, θ-actuator 206, and anchor 208, which are disposed on substrate 210.

In the depicted example, substrate 210 is a conventional single-crystal silicon wafer suitable for the formation of conventional integrated circuits. In some embodiments, substrate 210 is a different substrate suitable for use in planar-processing-based MEMS-device fabrication, such as a silicon-on-insulator substrate, a glass substrate, a compound semiconductor substrate, and the like. Materials suitable for use in substrate 210 include, without limitation, polysilicon, silicon carbide, silicon-germanium, III-V semiconductors, II-VI semiconductors, glasses, dielectrics, ceramics, composite materials, and the like.

Scanning element 202 is a MEMS-based, two-dimensional scanning diffractive element suitable for fabrication via planar processing techniques. Preferably, scanning element 202 is suitable for fabrication in a conventional CMOS foundry. Actuators suitable for use in scanning element 202, as well as methods suitable for forming them, are described in U.S. Patent Publication 20150047078, entitled "Scanning Probe Microscope Comprising an Isothermal Actuator," published Feb. 12, 2015, and U.S. Patent Publication 20070001248, entitled "MEMS Device Having Compact Actuator," published Jan. 4, 2007, each of which is incorporated herein by reference. In the depicted example, scanning element 202 includes a Fresnel zone plate; however, in some embodiments, MEMS scanner 102 includes a different scanning element, such as a different diffractive optical element (DOE), a mirror, a reflective lens, a refractive lens, a prism, a holographic element, and the like.

In the depicted example, scanning element 202 is an aluminum-based Fresnel lens that is configured to be movable relative to substrate 210 and operatively coupled with each of ϕ-actuator 204 and θ-actuator 206. In some embodiments, scanning element 202 comprises a different material suitable for use as a MEMS structural material, such as polysilicon, silicon carbide, silicon-germanium, silicon-dioxide a III-V semiconductor, a II-VI semiconductor, a composite material, and the like. In some embodiments, scanning element 202 has a shape other than circular, such as square, elliptical, irregular, etc.

Embodiments in accordance with the present disclosure are afforded significant advantages over the prior art by virtue of the use of electro-thermo-mechanical actuators to control the position of scanning element 202 about its rotation axes. Some of these advantages include:
  i. CMOS-compatible operating voltage (3.3V); or
  ii. small footprint (present embodiment 700 μm×700 μm); or
  iii. large static angular deflection (>+/−45 degrees mechanical in 2 DOF); or
  iv. low power (<10 mW); or
  v. high speed (≥5-kHz resonance); or
  vi. low cost; or
  vii. any combination of i, ii, iii, iv, v, and vi.

As a result, embodiments of the present invention preferably employ electro-thermo-mechanical actuators for each of φ-actuator 204 and θ-actuator 206. It is also preferred that each of φ-actuator 204 and θ-actuator 206 is an isothermal actuator since isothermal actuation mitigates parasitic effects that arise from thermal coupling between axes of rotation. For the purposes of this Specification, including the appended claims, "isothermal operation" is defined as operation at a constant power dissipation throughout an operating range. A device or system that operates in isothermal fashion dissipates constant power over its operating range, which results in a steady-state heat flow into and out of the device or system. For example, an isothermal actuator is an actuator that operates at a constant power throughout its operating range. In some cases, an isothermal actuator includes a plurality of actuating elements where at least one of the actuating elements operations in non-isothermal fashion; however, the plurality of actuating elements is arranged such that they collectively operate in isothermal fashion.

φ-actuator 204 is an isothermal torsional actuator operative for rotating scanning element 202 about the φ-axis, which is substantially aligned with the x-axis in the depicted example. φ-actuator 204 includes torsion elements 212-1 and 212-2, each of which is mechanically coupled between scanning element 202 and anchors 208 by beams 214. Beams 214 are rigid linkages comprising the same structural material as scanning element 202 (i.e., single-crystal silicon, aluminum and silicon dioxide, etc.).

Each of torsion elements 212-1 and 212-2 includes a plurality of bimorphs 216, which are grouped into operative sets. Adjacent operative sets are rigidly interconnected via beams 214 such that bending of the operative sets within a torsion element is additive. For clarity, elements comprising structural material (e.g., the material of scanning element 202, anchors 208, and beams 214) is depicted without cross-hatching, while bimorph elements 216 are depicted with cross-hatching.

Torsion elements 212-1 and 212-2 are rigidly connected rigid linkages 218 and arranged such that they rotate about the φ-axis in the same direction when subjected to opposite temperature changes. As a result, their collective power dissipation remains constant during operation. The temperature of torsion elements 212-1 and 212-2 is controlled via controlling electrical power dissipation (i.e., ohmic heating) in the elements themselves. In some embodiments, the temperature of the bimorphs in the torsional elements is controlled by controlling power dissipation in ohmic heaters disposed on the elements. In some embodiments, a heat source external to the torsion elements is used to control their temperature, such as heater elements disposed on the surface of substrate 210.

θ-actuator 206 is an isothermal piston actuator operative for rotating scanning element 202 about the θ-axis, which is substantially aligned with the y-axis in the depicted example. θ-actuator 206 comprises piston elements 220-1 through 220-4 (referred to, collectively, as piston elements 220) which are arranged in isothermal pairs. θ-actuator 206 is mechanically coupled between linkages 218 and anchors 208 by a set of beams 214. Each of piston elements 220 includes a plurality of beams 214 and bimorphs 216, which are arranged to give rise to vertical actuation in response to a temperature change. The temperature of piston elements 220 is controlled as described above and with respect to torsional elements 212.

Upon their release from substrate 210, piston elements 220 collectively move scanning element 202 in the positive z-direction (i.e., away from the substrate surface). Each of the piston elements is designed such that an increase in its power dissipation gives rise to its contraction, thereby moving its connection to scanning element 202 toward the substrate. Piston elements 220 are arranged in isothermal pairs—piston elements 220-1 and 220-2 and piston elements 220-2 and 220-4. As a result, an increase in the power dissipated in piston elements 220-2 and 220-2 and a commensurate decrease in the power dissipated in piston elements 220-1 and 220-4 induces positive (as indicated) rotation of scanning element 202 about the θ-axis while maintaining a constant power dissipation in θ-actuator 206 overall. In similar fashion, by decreasing the power dissipated in piston elements 220-2 and 220-2 and increasing the power dissipated in piston elements 220-1 and 220-4 by the same amount, a negative rotation of scanning element 202 about the θ-axis is induced while the power dissipated in θ-actuator 206 remains constant.

As noted above, piston elements are merely one type of isothermal actuator that can be used in a MEMS scanner without departing from the scope of the present disclosure. For example, another type of isothermal actuator described in detail in U.S. Patent Publication 20150047078 is a serpentine rotational actuator, which is preferable for use in some applications.

Figure 2B:
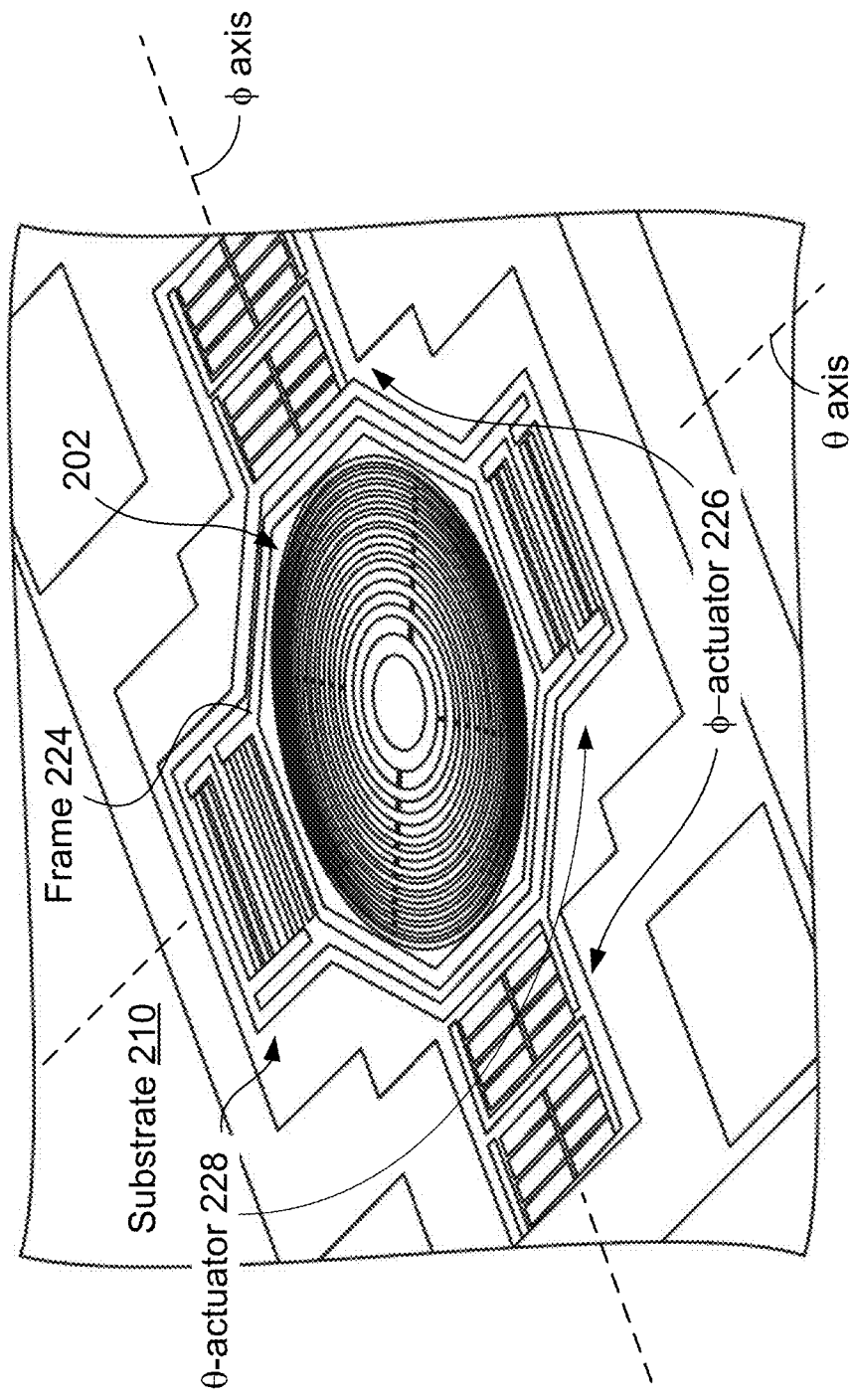
FIG. 2B depicts a schematic drawing of a perspective view of a MEMS scanner comprising serpentine rotational actuators in accordance with the present invention.

FIG. 2B depicts a schematic drawing of a perspective view of a MEMS scanner comprising serpentine rotational actuators in accordance with the present invention. MEMS scanner 222 is analogous to MEMS scanner 102; however, MEMS scanner 222 includes scanning element 202, frame 224, φ-actuator 226, and θ-actuator 228.

Frame 224 is a structural rigid frame of structural material.

Scanning element 202 is suspended within frame 224 via θ-actuator 228, while frame 224 is suspended above substrate 210 via φ-actuator 226.

Each of φ-actuator 226 and θ-actuator 228 is an isothermal serpentine rotational actuator that enables rotation about an axis with which the actuator is aligned. φ-actuator 226 and θ-actuator 228 are configured in a "gimbal" arrangement in which φ-actuator 226 is configured to rotate structurally rigid frame 228 about the φ-axis, while θ-actuator 228 is suspended within the frame and configured to rotate scanning element 202 about the θ-axis, which is orthogonal to the φ-axis.

The gimbal arrangement of φ-actuator 226 and θ-actuator 228 enables isothermal actuation with two rotational degrees of freedom.

It should be noted that the actuator and scanning element configuration of scanning element 202 is one of many possible MEMS-based scanning element configurations within the scope of the present invention. Some alternative embodiments in accordance with the present invention include a φ-actuator and/or θ-actuator that is actuated by another actuation means, such as electrostatic, electromagnetic, magnetostrictive, piezoelectric, and the like. Some alternative embodiments in accordance with the present invention include an φ-actuator and/or θ-actuator that is non-isothermal. Some alternative embodiments in accordance with the present invention include a movable mirror that includes an optical element, such as one or more diffractive lenses (e.g., a one- or two-dimensional Fresnel lens, a holographic lens, etc.), one or more refractive lenses, an active optical source, one or more diffraction gratings, one or more prisms, and the like.

It is desirable that scanners in accordance with the present disclosure mitigate the propagation of stray light, which can couple into other parts of larger systems in which the scanners are used. Preferably, therefore, MEMS scanner 102 includes optional regions 230, which are configured to enhance absorption of stray light and/or direct it to specific regions where it can be safely removed from the system.

FIG. 2C depicts a schematic drawing of a portion of a region 230 in accordance with the illustrative embodiment.

Region 230 includes a diffraction grating structure comprising alternative metal and clear regions, each having a width of approximately 1 micron.

FIG. 2D depicts a schematic drawing of a cross-sectional view of scanner 200, wherein stray light is directed by regions 230 to the sidewalls of body 124.

FIGS. 2E-F depict schematic drawings of top and cross-sectional views of an alternative stray-light-control region in accordance with the present disclosure.

Region 232 includes a plurality of vias 234, which create small divots that give rise to a textured surface for substrate 210. In some embodiments, divots are created in the topmost device layer of a CMOS fabrication process (e.g., Metal4 in a four-metal-layer process). In some embodiments, the divots arise from vias formed between two metal layers within a CMOS structure (e.g., vias formed between metal layers Metal3 and Metal4), thereby creating divots in the more upper of the two metal layers.

Layer 236 is formed over the textured surface to create a highly reflective diffractive surface. In the depicted example, layer 236 is a layer of aluminum; however, other materials can be used in layer 236 without departing from the scope of the present disclosure. In some embodiments, layer 236 is a multi-layer dielectric material stack that defines a Bragg structure whose reflectivity is selected to mitigate reflection of a specific wavelength or range of wavelengths.

Returning now to FIG. 1, housing 104 is a conventional ceramic package suitable for holding one or more integrated-circuit chips, which includes substrate 122, body 124, and cover 106, which collectively define chamber 126. Typically, chamber 126 is substantially sealed to create a protective environment for the light source and MEMS scanner. In some embodiments, chamber 126 is under vacuum. In some embodiments, chamber 126 is filled with a gas, such as forming gas, nitrogen, argon, and the like.

Substrate 122 is a conventional die-attach substrate suitable for mounting one or more semiconductor die, such as MEMS scanner 102, etc.

Body 124 is a conventional housing wall that is joined to substrate 122 in conventional fashion.

In the depicted example, each of substrate 122 and body 124 is made of low-temperature co-fired ceramic (LTCC); however, any of a variety of materials can be used for one or both of substrate 122 and body 124, including, without limitation, high-temperature co-fired ceramic (HTCC), other ceramics, printed circuit board (PCB), polymers, glasses, composite materials, molding compounds, etc.

Cover 106 is a conventional glass substrate that includes electrically conductive traces for enabling electrical connection between a pair of through-wafer vias 118 (referred to as vias 118) and light source 110. In some embodiments, cover 106 is made of a different suitable material, such as a glass, a plastic, a polymer (e.g., PMMA, SU-8, etc.), a composite material, another IR-transparent material, and the like.

In some embodiments, to further mitigate the transmission of stray light, cover 106 includes a layer of blocking material that is configured to prevent light transmission of all wavelengths of light through the cover other than the desired wavelength.

Cover 106 and body 124 are joined via conventional seal ring 108 to create a substantially sealed environment within housing 104.

In some embodiments, substrate 122 and body 124 are portions of a unitary structure and cover 106 is bonded to the upper portions of body 124 via seal ring 108. In some embodiments, body 124 and cover 106 are portions of a unitary body that is joined to substrate 122 via a seal ring analogous to seal ring 108.

In the depicted example, light source 110 is a conventional vertical cavity surface emitting laser (VCSEL) suitable for use in embodiments in accordance with the present disclosure. In some embodiments, a different light source, such as a super-luminescent diode, is included in scanner 100. One skilled in the art will recognize, after reading this Specification, that the choice of light source 110 normally depends on the detector used with scanner 100. Typically, scanner 100 is intended for operation with a silicon photo-detector, which is sensitive for wavelengths up to 1100 nm; however, other light detectors and/or wavelengths can be used without departing from the scope of the present disclosure.

Light source 110 is bonded to cover 106 in conventional fashion. One of vias 118 is electrically connected to ground and is routed such that it electrically connects with the substrate of the VCSEL, while the other via 118 is electrically connected to a top contact on light source 110 via wirebond 116. Vias 118 are electrically connected with a pair of I/O pads 112, which are conventional surface-mount pads suitable for subsequent assembly using standard PCB techniques.

In similar fashion, electrical connection to MEMS scanner 102 is made via a plurality of through-wafer vias 120, (referred to as vias 120) wirebonds 114, and a set of I/O pads 112. Through-wafer vias 120 are formed such that they extend through the thickness of substrate 122.

In some embodiments, scanner 100 has an overall package height that is constrained by the focal length of DOE 202.

In some embodiments, electrical connection to at least one of MEMS scanner 102 and light source 110 is made via connections other than through-vias. One skilled in the art will recognize, after reading this Specification, that the inclusion of through-wafer vias in scanner 100 can increase cost.

It should also be noted that the heat load of the VCSEL must be managed on cover 106 through a thermally conductive path.

In some embodiments, light source 110 is located elsewhere in the package; therefore, electrical routing is not included on cover 106 to reduce cost.

Figure 3:
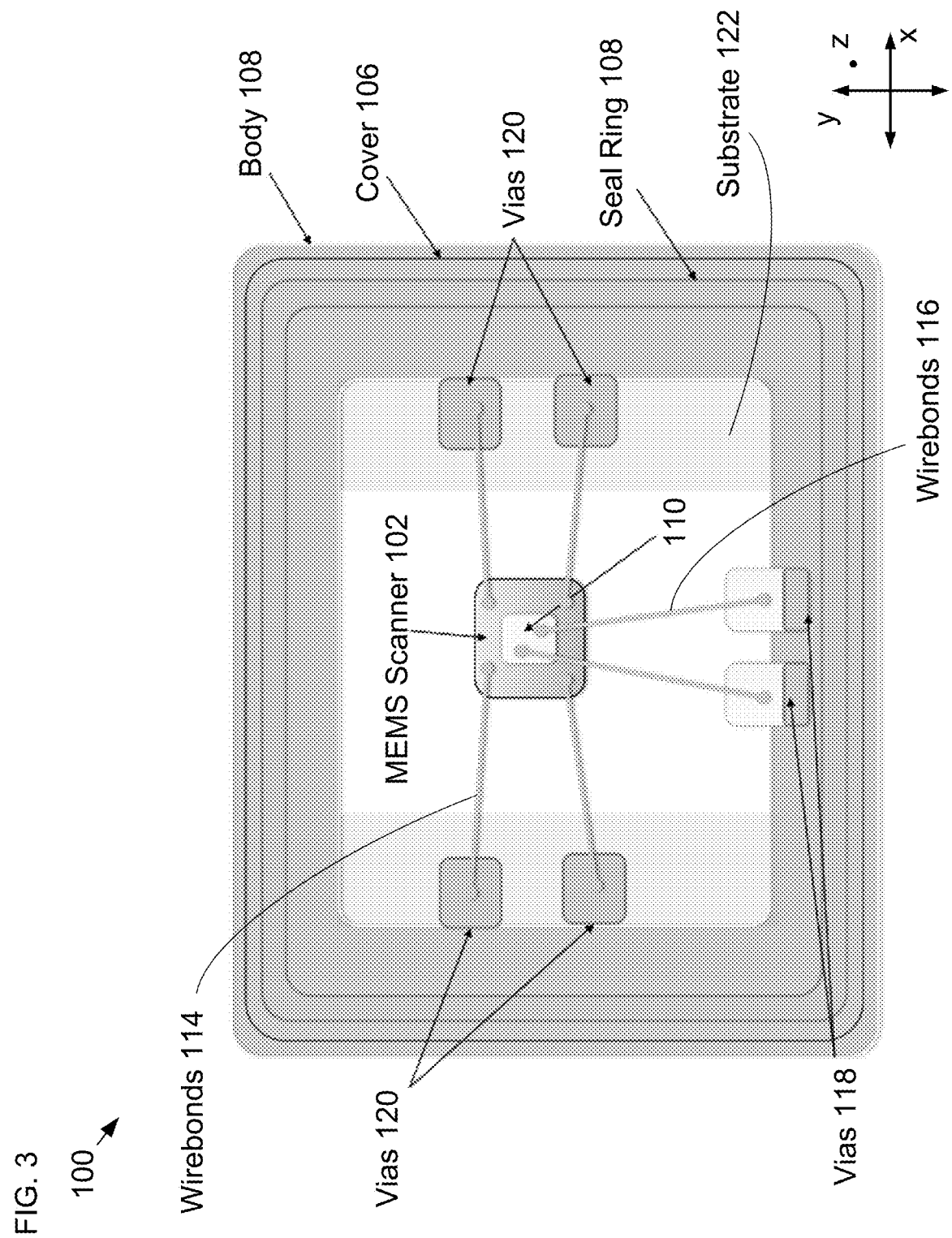
FIG. 3 depicts a top view of scanner 100.

FIG. 3 depicts a top view of scanner 100.

FIG. 4A depicts a schematic drawing of a cross-sectional view of an alternative embodiment of light scanner suitable for use in an object-tracking system in accordance with the present disclosure. Scanner 400 includes MEMS scanner 402, light source 110, and mirror 408, all of which are contained within housing 104 (not shown). Scanner 400 is characterized by a packaging configuration that reduces cavity height and provides a high-quality output beam.

MEMS scanner 402 is analogous to MEMS scanner 102; however, MEMS scanner 402 includes DOE 404 and cavity 406.

MEMS scanner 402 is configured such that substrate 210 includes cavity 406, in which light source 110 resides when assembled within housing 104.

DOE 402 is a diffractive element that collimates and directs light emitted by light source 110 toward mirror 408.

FIG. 4B depicts a schematic drawing of a top view of DOE 402. DOE 402 is a substantially circular field of alternating lines and spaces, which are configured to collimate the diverging light emitted by light source 110 and direct the collimated beam at an approximately 20-degree angle to direct it toward mirror 408. In the depicted example, DOE 402 has a diameter of approximately 300 microns and its lines and spaces shrink in substantially gradient fashion from approximately 2.7 microns at one side to approximately 0.95 microns at the opposite end.

Mirror 408 is a conventional flat mirror disposed on the inside surface of cover 106. Mirror 408 receives the collimated beam from DOE 404 and directs it toward scanning element 202.

Light source 110, DOE 404, mirror 408, and scanning element 202 collectively define light path 410. Light source 110 and DOE 404 are separated by h1, while DOE 404 and mirror 408 are separated by h2. In the depicted example, each of h1 and h2 is approximately 500 microns; however, any practical value can be used for h1 and/or h2 without departing from the scope of the present disclosure.

It should be noted that the optical design of scanner 400 mitigates higher order diffraction orders in the 1st order, thereby enabling a cleaner output beam 412. In addition, by eliminating the collimation functionality from MEMS scanner 102, aberration in output beam 412 due to scanning is reduced.

FIG. 5 depicts a schematic drawing of a cross-sectional view of another alternative embodiment of light scanner suitable for use in an object-tracking system in accordance with the present disclosure. Scanner 500 includes MEMS scanner 102, light source 110, and DOE 502, all of which are contained within housing 104 (not shown).

DOE 502 is analogous to DOE 404 described above; however, DOE 502 is configured to redirect the light provided by light source 110 at a large angle of deflection to steer it toward scanning element 202 of MEMS scanner 102.

MEMS scanner 102, light source 110, and DOE 502 are arranged to define a light path that provides output beam 504. In the depicted example, light source 110 and DOE 502 are separated by h3, which is approximately 300 microns; however, any practical value can be used for h3 without departing from the scope of the present disclosure.

It should be noted that optical elements, such as DOE 502, can be defined on cover 106 in myriad ways, including injection molding, lithography, etc. In some embodiments, DOE 502 enables the generation of point clouds or other patterns as a steered light beam passes through it. Such point clouds and patterns can be used, for example, for calibration, LIDAR-type measurements, and the like.

FIG. 6 depicts a schematic drawing of a cross-sectional view of another alternative embodiment of light scanner suitable for use in an object-tracking system in accordance with the present disclosure. Scanner 600 includes MEMS scanner 102, light source 110, and DOE 602, and element 604, all of which are contained within housing 104 (not shown).

DOE 602 is analogous to DOE 404 described above; however, DOE 602 is formed directly on the top of light source 110 such that it is configured to collimate the light provided by light source 110 and redirect it toward element 604, which disposed on the inner surface of cover 106.

Element 604 is a conventional flat mirror that receives the collimated beam from DOE 602 and reflects it toward scanning element 202 at the same angle at which it was received. In some embodiments, element 604 is a different reflective element, such as a diffraction grating, blazed grating, hologram, etc., which is suitable for redirecting the collimated beam received from DOE 602 toward scanning element 202 at a different angle than its incidence angle.

MEMS scanner 102, light source 110, DOE 602, and mirror 604 are arranged to collectively define a light path that defines output beam 606. In the depicted example, DOE 602 and mirror 604 are separated by h3.

Figure 7A:
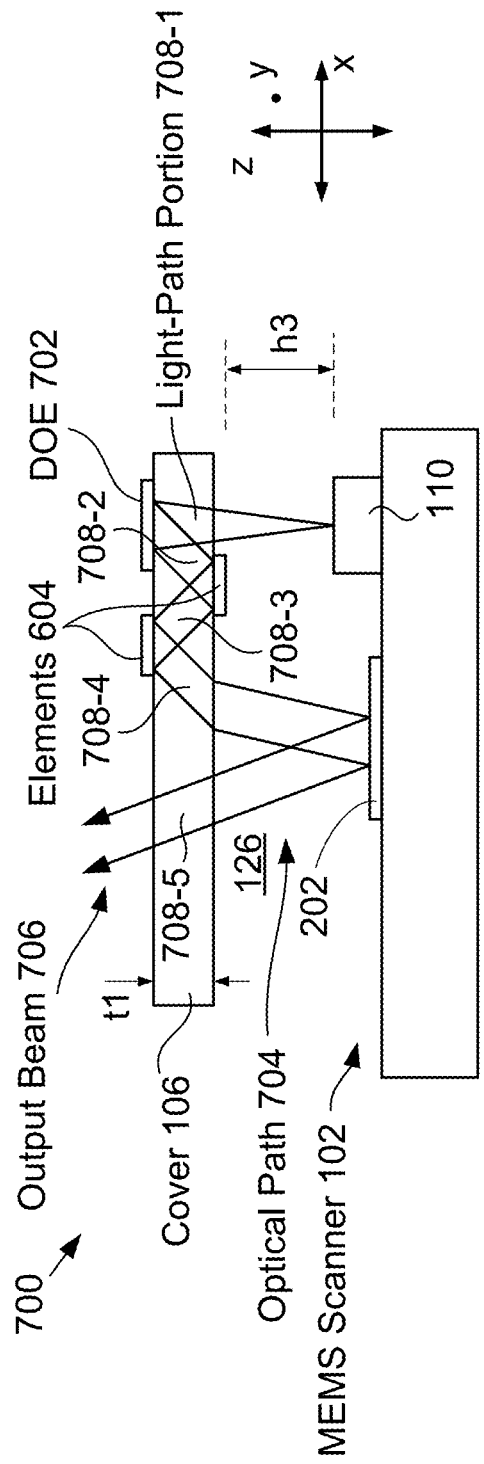
FIGS. 7A-B depict schematic drawings of cross-sectional views of non-limiting examples of alternative embodiments of light scanners having folded optical paths in accordance with the present disclosure.
Figure 7B:
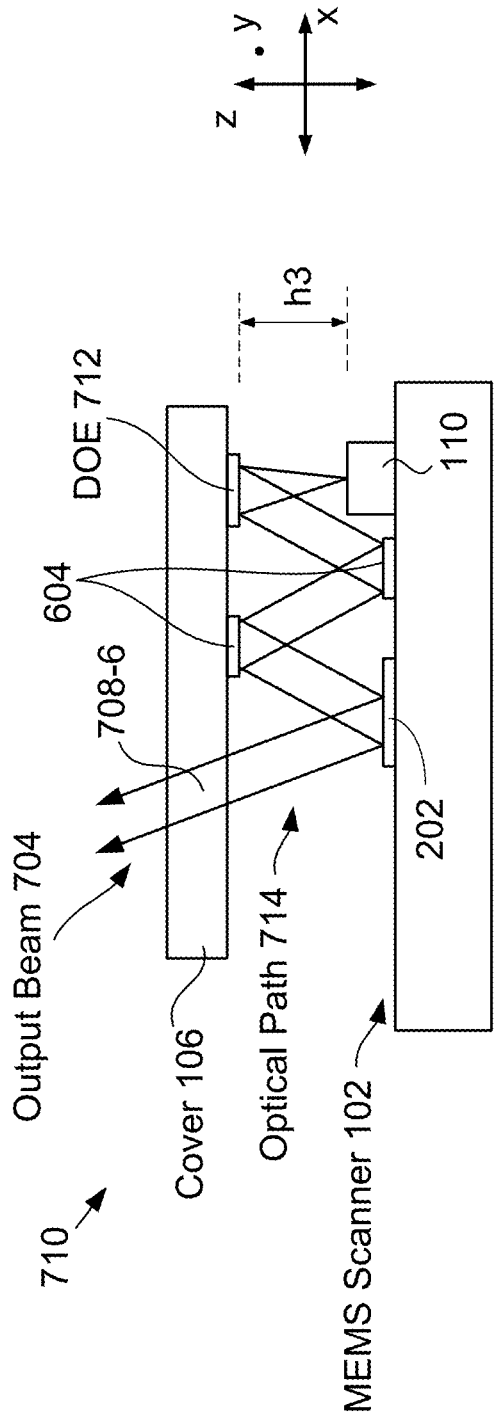

FIGS. 7A-B depict schematic drawings of cross-sectional views of non-limiting examples of alternative embodiments of light scanners having folded optical paths in accordance with the present disclosure.

Scanner 700 includes MEMS scanner 102, light source 110, and DOE 702, and two elements 604.

DOE 702 is analogous to DOE 404 described above.

In scanner 700, DOE 702 and one element 604 are disposed on the outer surface of cover 106; therefore, they reside outside of chamber 126 to define light path 704 and output beam 704. A second element 604 is disposed on the inner surface of cover 106. As a result, DOE 702 and elements 604 are arranged to fold a portion of optical path 704 such that it includes a plurality of light-path portions (i.e., light-path portions 708-1 through 708-5), each of which transits the thickness, t1, of cover 106.

In similar fashion, scanner 710 includes MEMS scanner 102, light source 110, and DOE 712, and a pair of elements 604, all of which are contained within housing 104 (not shown) to define light path 714. As a result, DOE 712 and elements 604 are arranged to fold a portion of optical path 714 such that it includes only one light-path portion located within the interior of cover 106 (i.e., light-path portion 708-6).

It should be noted that, because the folded portions of optical path 714 are typically longer than the folded portions of optical path 704, DOE 712 can be designed to impart a smaller deflection angle on the light signal provided by light source 110.

Figure 8A:
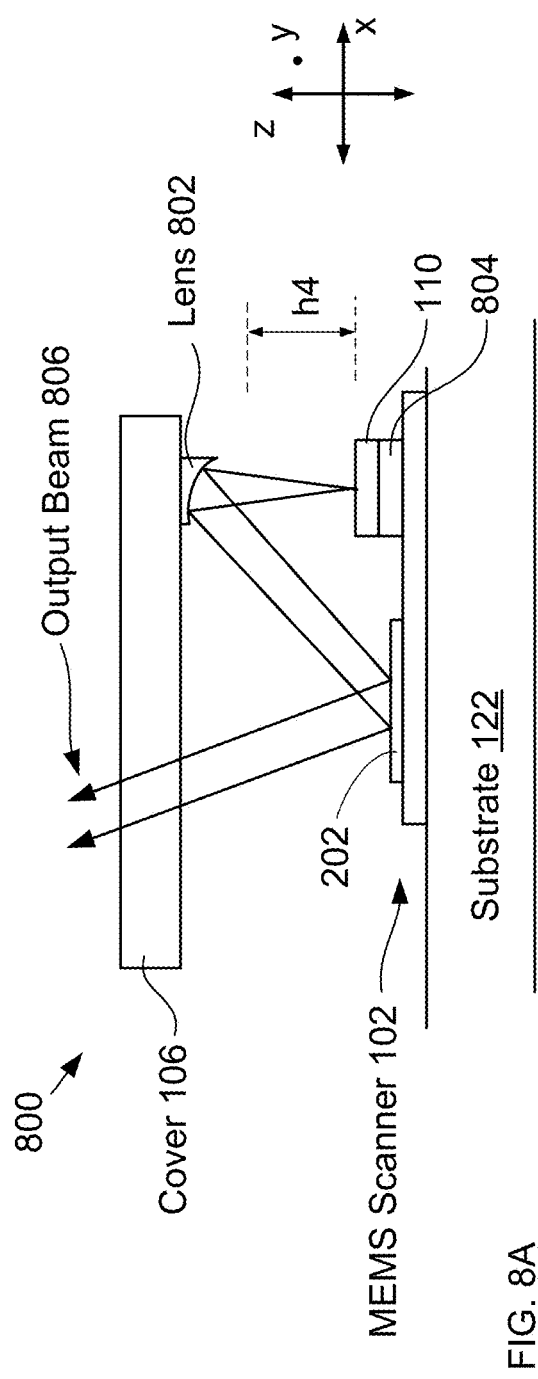
FIG. 8A depicts a schematic drawing of a cross-sectional view of a non-limiting example of an alternative embodiment of a light scanner comprising a reflective lens in accordance with the present disclosure.

FIG. 8A depicts a schematic drawing of a cross-sectional view of a non-limiting example of an alternative embodiment of a light scanner comprising a reflective lens in accordance with the present disclosure.

Scanner 800 is analogous to scanner 500; however, scanner 800 employs a reflective lens for collimating the light provided by light source 110 and redirecting it to MEMS scanner 102. Scanner 800 includes MEMS scanner 102, light source 110, and lens 802, and optional spacer 804.

Lens 802 is a curved mirror configured as an off-axis parabolic mirror (OAP). Lens 802 is configured to collimate the light provided by light source 110 and direct the collimated beam to scanning element 202 of MEMS scanner 102, which is operative for scanning output beam 806 in two dimensions.

Lens 802 is disposed on spacer 804, whose thickness is selected to establish the proper distance, h4, between the top of light source 110 and lens 802. In the depicted example, h4 is 400 microns; however, any practical value can be used for h4. Typically, h4 is within the range of 200 microns to 2.5 mm. In some embodiments, lens 802 has a shape other than an off-axis parabola, such as spherical, aspherical, free-form, etc.

In the depicted example, spacer 804 is a conventional integrated-circuit spacer that is bonded to the top surface of substrate 210. In some embodiments, spacer 804 is a different element, such as a wirebond shelf, a raised portion of substrate 210, etc. In some embodiments, spacer 804 is operatively coupled with electrostatic discharge (ESD) prevention electronics.

Figure 8B:
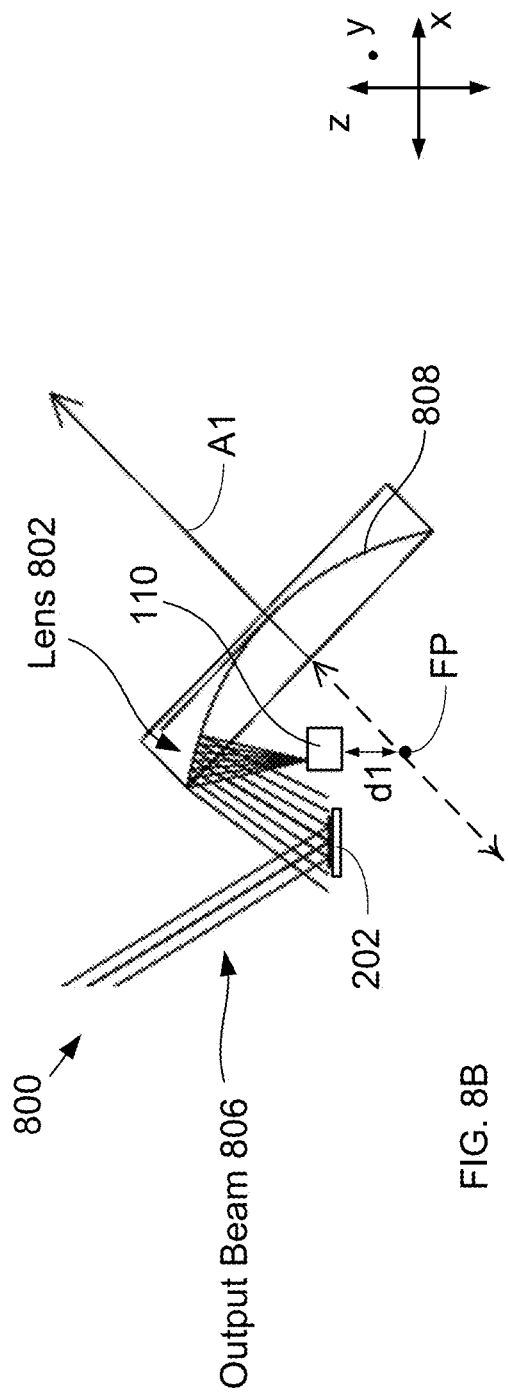
FIG. 8B depicts a schematic drawing of a cross-sectional view of a non-limiting example of a design for lens 802.

FIG. 8B depicts a schematic drawing of a cross-sectional view of a non-limiting example of a design for lens 802.

Lens 802 is designed such that no spherical aberration occurs when light source 110 is located at its focal point. The curvature of the reflective surface of lens 802 is that of a portion of parent parabola 808, which is characterized by focal point FP and axis of symmetry A1.

It should be noted that, in practice, scanning element 202 typically exhibits curvature that will give rise to phase-front error in the light signal reflected from it. It is an aspect of the present disclosure, however, that by configuring an optical path in which light source 110 is displaced from focal point FP by distance, d1, phase-front error in output signal 806 due to the curvature of scanning element 202 is mitigated or completely canceled.

Figure 8C:
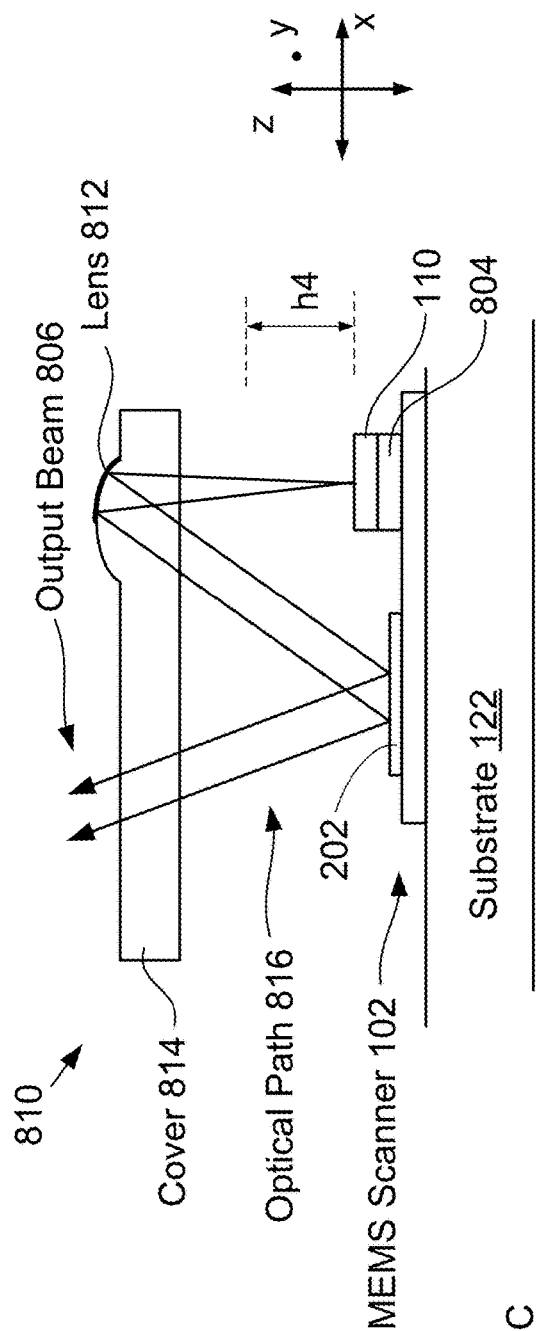
FIG. 8C depicts a schematic drawing of a cross-sectional view of another non-limiting example of an alternative embodiment of a light scanner comprising a reflective lens in accordance with the present disclosure.

FIG. 8C depicts a schematic drawing of a cross-sectional view of another non-limiting example of an alternative embodiment of a light scanner comprising a reflective lens in accordance with the present disclosure.

Scanner 810 is analogous to scanner 800; however, scanner 810 includes a housing whose cover includes a lens for collimating light received from light source 110 and directing the collimated beam to scanning element 202, where the lens is integrated into its top surface.

Lens 812 is analogous to lens 802; however, lens 812 is designed to accommodate the fact that optical path 816 includes portions of cover 814 that reside between light source 110 and the lens and between the lens and scanning element 202.

Figure 8D:
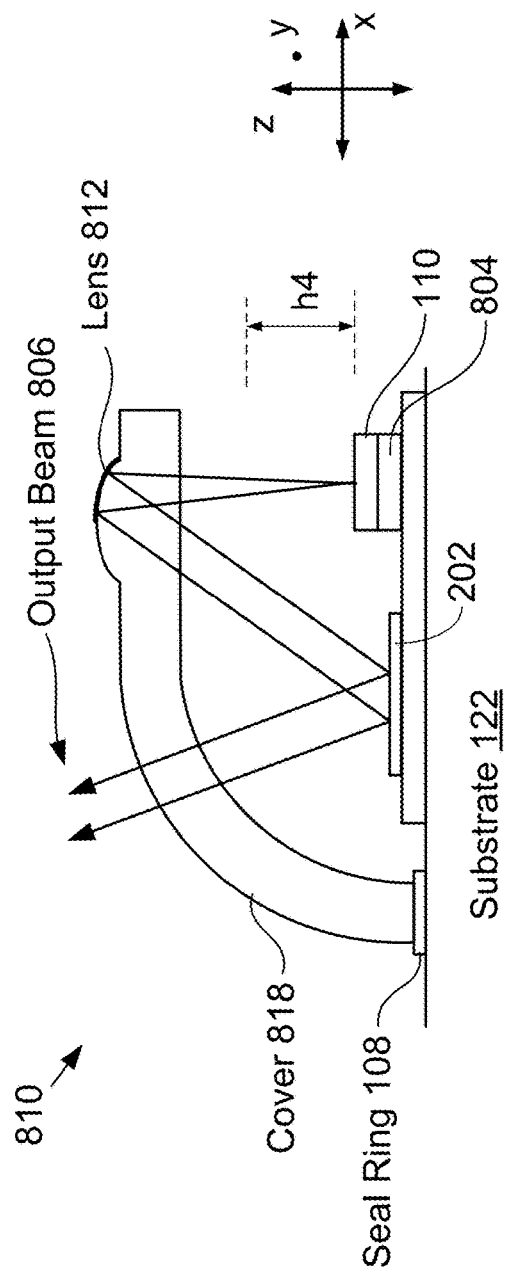
FIG. 8D depicts a schematic drawing of a cross-sectional view of a portion of scanner 810 comprising an alternative cover suitable for use in a housing in accordance with the present disclosure.

FIG. 8D depicts a schematic drawing of a cross-sectional view of a portion of scanner 810 comprising an alternative cover suitable for use in a housing in accordance with the present disclosure.

Cover 818 is analogous to cover 106; however, cover 818 is integrated with body 124 to define a unitary element having a curved sidewall. In some embodiments, the curved sidewall provides some lensing functionality that augments the beam-steering capability of scanning element 202. In some embodiments, cover 818 has a chamfered sidewall.

Figure 9:
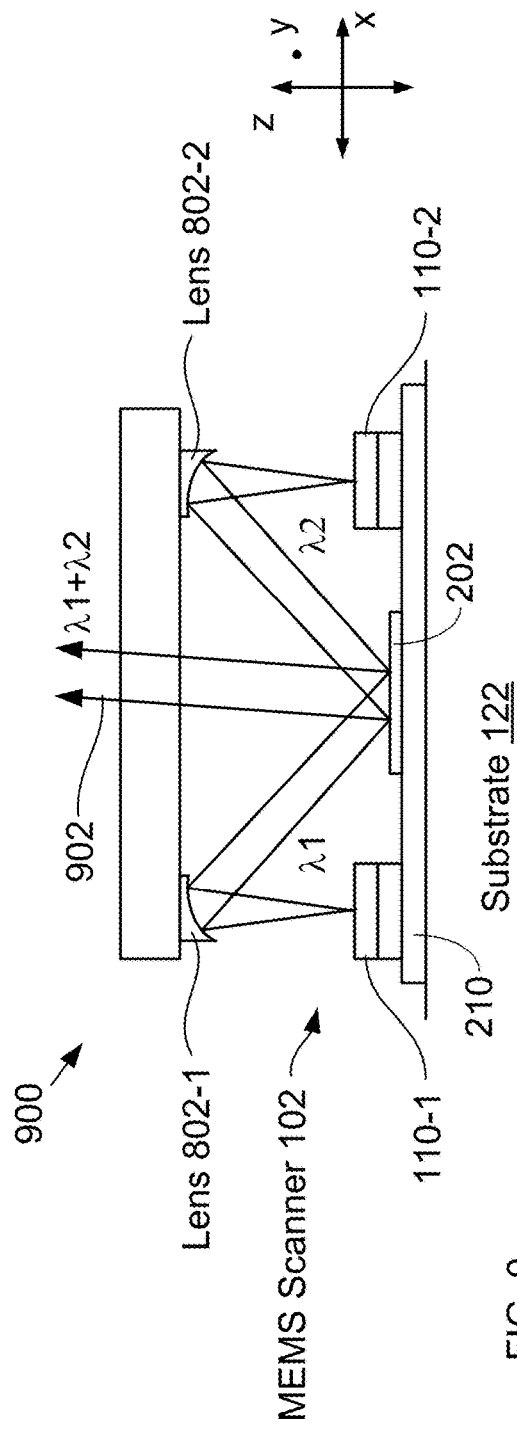
FIG. 9 depicts a schematic drawing of a cross-sectional view of another alternative embodiment of a light scanner in accordance with the present disclosure.

FIG. 9 depicts a schematic drawing of a cross-sectional view of another alternative embodiment of a light scanner in accordance with the present disclosure.

Scanner 900 is analogous to scanner 800; however, scanner 900 a plurality of light sources and reflective lenses that provide a plurality of collimated light beams to MEMS scanner 102. It should be noted that, although only two light sources and lenses are depicted in FIG. 9, any practical number of light sources and lenses can be included in a scanner without departing from the scope of the present invention.

In the depicted example, the light signals provided by light sources 110-1 and 110-2 (referred to, collectively, as light sources 110) are characterized by different wavelengths. As a result, the light signals are combined into multi-wavelength output beam 902 by scanning element 202 of MEMS scanner 102. In some embodiments, a plurality of light sources provides light signals characterized by the same wavelength or wavelengths.

Furthermore, although scanner 900 includes reflective lenses that collimate and redirect the light emitted by light sources 110, in some embodiments, the light provided by at least one light source is collimated and/or redirected by a different optical element, such as DOE, diffraction grating, blazed grating, prism, etc. Still further, in some embodiments, light sources 110 are multiplexed and/or independently modulated.

Figure 10:
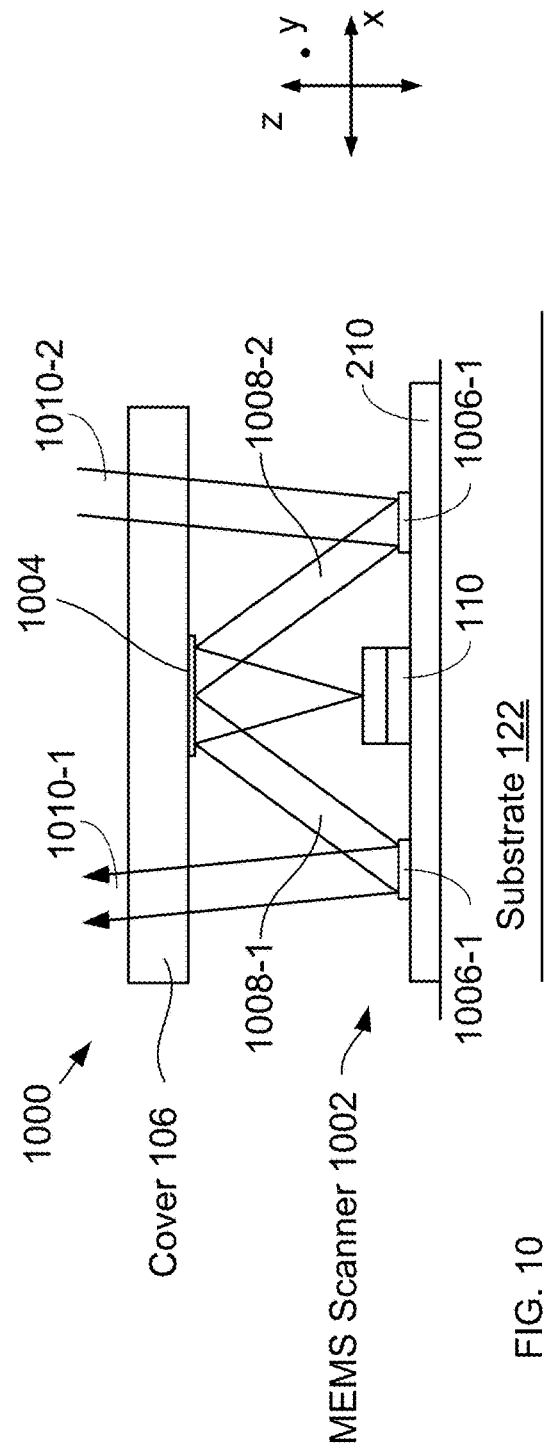
FIG. 10 depicts a schematic drawing of a cross-sectional view of another alternative embodiment of a light scanner in accordance with the present disclosure.

FIG. 10 depicts a schematic drawing of a cross-sectional view of another alternative embodiment of a light scanner in accordance with the present disclosure. Scanner 1000 includes MEMS scanner 1002, element 1004, and light source 110.

Scanner 1000 is analogous to scanner 500; however, system 1000 includes element 1004, which splits light provided by light source 110 into a plurality of collimated beams (i.e., beams 1008-1 and 1008-2), each of which is directed to a different, independently controllable, MEMS-based scanning mirror. As a result, system 1000 is operative for independently steering multiple output beams.

MEMS scanner 1002 is analogous to MEMS scanner 102; however, MEMS scanner 1002 includes multiple independently controllable scanning elements (i.e., scanning elements 1006-1 and 1006-2).

In the depicted example, each of scanning elements 1006-1 and 1006-2 is a DOE that is configured to project a line, such that the lines that form a crosshair on an object on which output signals 1010-1 and 1010-2 are incident. In some embodiments, at least one of scanning elements 1006-1 and 1006-2 is an element other than a DOE that generates a linear optical signal, such as a different DOE, a planar mirror, etc.

Element 1004 is analogous to DOE 404; however, element 1004 is a hologram that splits the light provided by light source 110 into collimated light beams 1008-1 and 1008-2, which are directed at scanning elements 1006-1 and 1006-2, respectively. In some embodiments, element 1004 is a diffractive optical element other than a hologram.

In addition to projecting output signals 1010-1 and 1010-2 are orthogonal lines of light, elements 1004-1 and 1004-2 independently steer the output signals in two-dimensions.

It should be noted that, although scanner 1000 is configured to enable control of only two output signals, analogous scanners can be configured to control any practical number of output signals without departing from the scope of the present invention.

FIG. 11A depicts a schematic drawing of a cross-sectional view of another alternative embodiment of a light scanner in accordance with the present disclosure. Scanner 1100 includes MEMS scanner 1102, body 1104, and light source 110.

MEMS scanner 1102 is analogous to MEMS scanner 102; however, MEMS scanner 1102 includes aperture 1110, which is configured to enable output beam 1112 to pass through the substrate of the MEMS scanner without perturbation.

Body 1104 is a unitary element having the combined functionality of substrate 122 and body 124 described above; however, body 1104 also includes cavity 1106 that defines sidewall 1108, which is reflective for the light emitted by light source 110. Body 1104 also includes a through-wafer via (not shown) to enable electrical connectivity to light source 110, which is disposed on the bottom surface of cavity 1106.

In the depicted example, body 1104 is a single-crystal silicon substrate and cavity 1106 is formed via a crystallographic-dependent etch, such as potassium hydroxide (KOH), ethylene diamine pyrocatechol (EDP), hydrazine, etc.; however, any suitable etch process can be used to form cavity 1106 without departing from the scope of the present disclosure.

The elements of scanner 1100 are configured such that the light emitted by light source 110 is collimated and redirected by DOE 404 toward sidewall 1108.

It should be noted that the arrangement of scanner 1100 enables a wafer-bonded housing that can be sealed in vacuum, an inert gas, etc.

FIG. 11B depicts a schematic drawing of a cross-sectional view of another alternative embodiment of a light scanner in accordance with the present disclosure. Scanner 1114 is analogous to scanner 1100; however, scanner 1114 also includes DOE 1116, which is a diffraction grating that distributes output beam 1112 into a plurality of output beamlets 1118. In some embodiments, DOE 1116 is an element other than a diffraction grating, as discussed above.

It should be noted that DOE 1116 can be employed with any scanner in accordance with the present disclosure to create a plurality of output beamlets from the output beam provided by the scanner.

Figure 12:
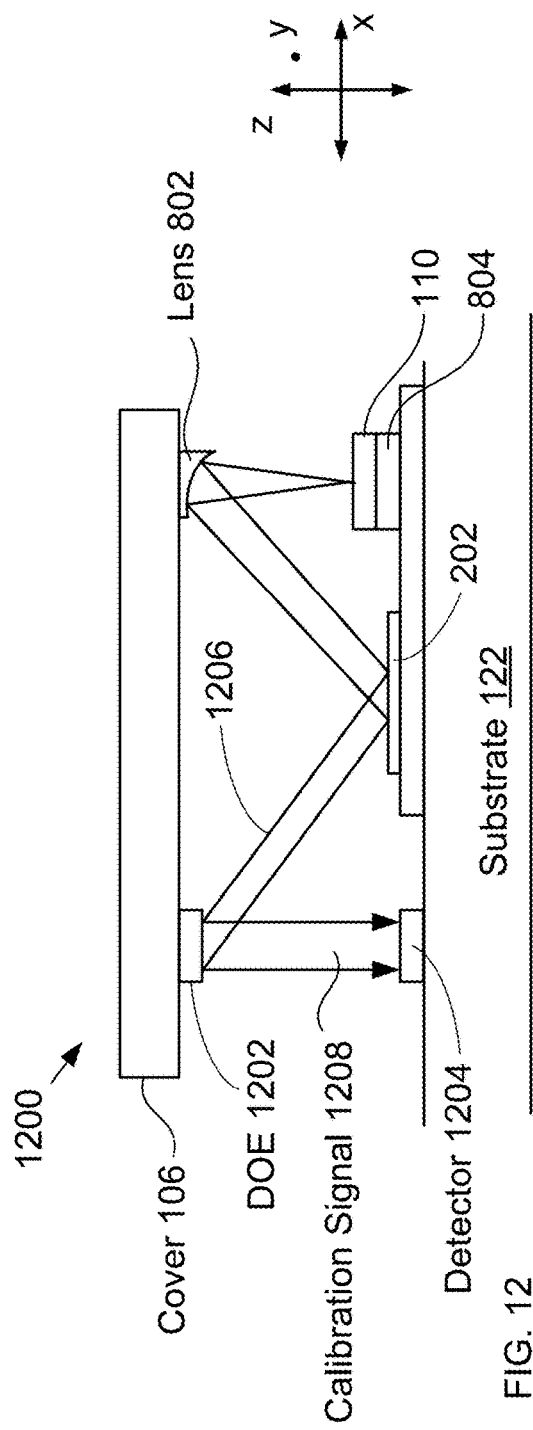
FIG. 12 depicts a schematic drawing of a cross-sectional view of another alternative embodiment of a light scanner in accordance with the present disclosure.

FIG. 12 depicts a schematic drawing of a cross-sectional view of another alternative embodiment of a light scanner in accordance with the present disclosure. Scanner 1200 includes scanner 800, element 1202, and detector 1204.

In the depicted example, element 1202 is a diffraction grating that redirects beam 1206 to conventional detector 1204. In some embodiments, element 1202 is an element other than a diffraction grating, such as a reflective lens, etc., as discussed above.

Element 1202 and detector 1204 collectively define subsystem that enables calibration of scanner 1200 by projecting a portion of output beam 1206 to a known location (i.e., the position of conventional detector 1204) as calibration signal 1208. As a result, the drive signal associated with a particular position of scanning element 202 can be readily determined.

In some embodiments, light is directed at a known angle onto cover 106, where metal patterns on top and bottom of the lid are defined to function as a wave guide that directs the light onto a photodiode.

Figure 13:
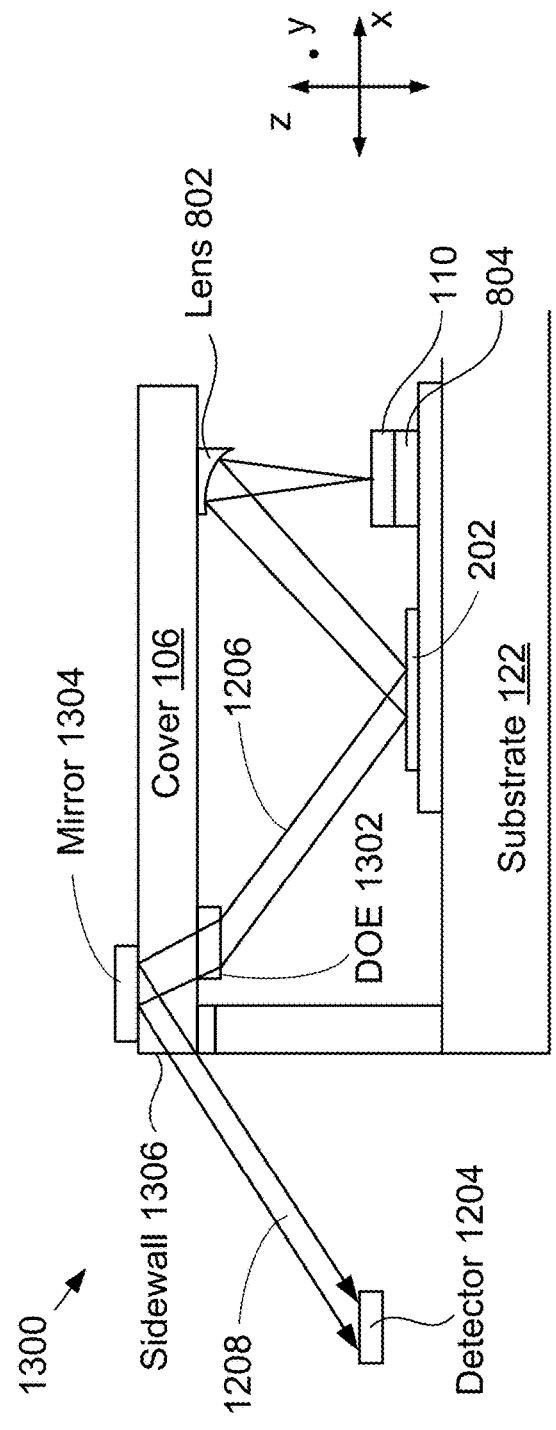
FIG. 13 depicts a schematic drawing of a cross-sectional view of another alternative embodiment of a light scanner in accordance with the present disclosure.

FIG. 13 depicts a schematic drawing of a cross-sectional view of another alternative embodiment of a light scanner in accordance with the present disclosure. Scanner 1300 is analogous to scanner 1200; however, scanner 1300 includes DOE 1302 and mirror 1304 and detector 1204, which is located outside of housing 104. Furthermore, in scanner 1300, the DOE and mirror are configured to collectively direct calibration signal 1208 toward detector 1204 through sidewall 1306 of cover 106.

FIG. 14 depicts a schematic drawing of a cross-sectional view of alternative cover suitable for use in a housing in accordance with the present disclosure. Cover 1400 is analogous to cover 106; however, cover 1400 includes lens 1402.

Lens 1402 is a dome-shaped refractive lens molded into the top surface of cover 106 such output beam 1206 is scattered into diffused optical energy 1404. As a result, when coupled with a detector, such as described above vis-à-vis scanner 1200, lens 1402 gives rise to zero signal when mirror 402 directs output beam 1206 toward the lens, thereby enabling calibration of the angle of deflection of the MEMS scanner for that beam position.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A scanner for steering a first output signal in at least one dimension, the scanner comprising:
   a light source configured to provide a first light signal;
   a first element configured to receive the first light signal and provide a first portion of the first light signal as a collimated beam;
   a scanning element that is a MEMS-based scanning element, the scanning element including a first actuator operative for steering the first portion in a first dimension, wherein the first actuator is a thermal actuator; and
   a housing that includes a substrate, a body, and a cover having a thickness, the cover comprising a first material that is substantially transparent for the first portion, wherein the substrate, body, and cover collectively define a sealed chamber that contains the light source and the scanning element;
   wherein the first output signal includes the first portion.

2. The apparatus of claim 1 wherein the scanning element is operative for steering the first portion in two dimensions.

3. The apparatus of claim 1 wherein the scanning element includes the first element.

4. The apparatus of claim 1 wherein the first element is selected from the group consisting of a mirror, a diffractive optical element (DOE), and a prism.

5. The apparatus of claim 1 wherein the first actuator is an isothermal actuator.

6. The apparatus of claim 1 wherein the first element is disposed on a first surface of the cover.

7. The apparatus of claim 6 wherein the first surface is outside the chamber.

8. The apparatus of claim 7 wherein the first element, the light source, and the scanning element are arranged to define an optical path that includes a plurality of light-path portions that transit the thickness of the cover.

9. The apparatus of claim 1 further comprising a second element configured to distribute the first portion into a plurality of beamlets that includes the first output signal.

10. The apparatus of claim 1 further comprising:
    a second element that is configured to split the first light signal into a plurality of second light signals; and
    a plurality of scanning elements that includes the first scanning element, wherein each scanning element of the plurality thereof is configured to steer a different second light signal of the plurality thereof in at least one dimension, and wherein the plurality of second light signals includes the first portion.

11. The apparatus of claim 1 wherein the scanning element includes a first region that is configured to direct a second portion of the first light signal along a direction that is unaligned with the first portion.

12. The apparatus of claim 1 further comprising a second element and a detector, wherein the second element is configured to direct at least some of the first portion toward the detector as a calibration signal when the first portion is aligned with a first direction.

13. The apparatus of claim 12 wherein the detector is located outside of the housing.

14. The apparatus of claim 13 wherein cover includes a sidewall, and wherein the calibration signal transits the sidewall.

15. The apparatus of claim 1 wherein the first element includes a reflective lens that has a focal point, and wherein the first element receives the first light signal from the light source, and further wherein the first element and light source are arranged such that the light source is displaced from the focal point by a first distance that is a non-zero distance.

16. The apparatus of claim 15 wherein the first distance is based on a curvature of the scanning element.

17. The apparatus of claim 1 wherein the cover is configured to inhibit passage of a second portion of the first light signal through the cover, wherein the first portion is characterized by a first wavelength and the second portion is characterized by a second wavelength.

18. A scanner for steering a first output signal in at least one dimension, the scanner comprising:
  a light source configured to provide a first light signal;
  a first element configured to receive the first light signal and provide a first portion of the first light signal as a collimated beam;
  a scanning element that is a MEMS-based scanning element, the scanning element being operative for steering the first portion in a first dimension; and
  an integrated-circuit-chip package that includes a substrate, a body, and a cover having a thickness, the cover comprising a first material that is substantially transparent for the first portion, wherein the substrate, body, and cover collectively define a low-profile housing that encloses a sealed chamber that contains the light source and the scanning element;
  wherein the first output signal includes the first portion.

19. The scanner of claim 18 wherein the sealed chamber contains a vacuum.

20. A scanner for steering a first output signal in at least one dimension, the scanner comprising:
  a light source configured to provide a first light signal;
  a first element configured to receive the first light signal and provide a first portion of the first light signal as a collimated beam;
  a scanning element that is a MEMS-based scanning element, the scanning element being operative for steering the first portion in a first dimension, wherein the scanning element is configured to at least partially collimate the first portion; and
  an integrated-circuit-chip package that includes a substrate, a body, and a cover having a thickness, the cover comprising a first material that is substantially transparent for the first portion, wherein the substrate, body, and cover collectively define a low-profile housing that encloses a sealed chamber that contains the light source and the scanning element;
  wherein the first output signal includes the first portion.

* * * * *